(12) United States Patent
Chiang (10) Patent No.: US 7,033,198 B2
(45) Date of Patent: Apr. 25, 2006

(54) LATCH DEVICE FOR SOCKET CONNECTOR

(75) Inventor: Chun-Hsiang Chiang, Taipei Hsien (TW)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/871,901

(22) Filed: Jun. 18, 2004

(65) Prior Publication Data
US 2004/0259407 A1    Dec. 23, 2004

(30) Foreign Application Priority Data
Jun. 20, 2003    (TW) .............................. 92211313 U (51) Int. Cl.
*H01R 13/62* (2006.01)

(52) U.S. Cl. .................................................... 439/331

(58) Field of Classification Search ................ 439/331, 439/73
See application file for complete search history.

(56) References Cited

U.S. PATENT DOCUMENTS

| 4,354,720 A | * | 10/1982 | Bakermans .................. 439/357 |
| 4,560,216 A | * | 12/1985 | Egawa ......................... 439/41 |
| 6,244,875 B1 | * | 6/2001 | McHugh et al. .............. 439/73 |
| 6,561,825 B1 | * | 5/2003 | McHugh et al. ............ 439/135 |
| 6,646,881 B1 | * | 11/2003 | Lai et al. ..................... 361/719 |
| 6,648,656 B1 | * | 11/2003 | Ma et al. ...................... 439/73 |
| 6,735,085 B1 | * | 5/2004 | McHugh et al. ............ 361/719 |
| 6,776,625 B1 | * | 8/2004 | Ma .............................. 439/73 |
| 6,778,395 B1 | * | 8/2004 | Dong et al. .................. 361/704 |

* cited by examiner

*Primary Examiner*—Neil Abrams
(74) *Attorney, Agent, or Firm*—Robert J. Zeitler (57) ABSTRACT

A latch device is used for a socket connector and includes a base, a pressing frame and a pressing rod. The pressing frame is pivotally connected to the base and has a flange on one side thereof. The pressing rod is pivotally arranged on the base and has a protrusion. The socket connector is arranged between the base and the pressing frame and a CPU is mounted on the socket connector. The pressing rod is operated such that the protrusion is pressed against the flange. The pressing frame is pressed against the CPU, whereby the CPU is also retained on the socket connector.

14 Claims, 11 Drawing Sheets

LATCH DEVICE FOR SOCKET CONNECTOR

FIELD OF THE INVENTION

The present invention relates to a latch device for socket connector, and more particularly, to an improved latch structure used for a socket connector pressed against a central processing unit (CPU) such that the CPU is retained to the socket connector.

BACKGROUND OF THE INVENTION

It is necessary to arrange a socket connector to connect a conventional CPU with a circuit board. Conventional socket connectors are mounted on the circuit board by solder ball or by inserting pins into apertures in the circuit board such that the socket connector electrically connects with the circuit board.

Conventional CPUs are generally electrically connected to the socket connector by pins on the CPU which then mate with the terminals of the socket connector regardless of how the socket connector is mounted on the circuit board.

CPUs today, and in the future, appear to be trending towards modularity to make speed and power of the computer faster and stronger. Therefore, CPU manufacturers appear to moving to CPUs that do not have the traditional pins for insertion into the socket connector. Rather, the CPU electrically connects to the socket connector by a pressing force. Because the CPU does not have traditional pins to allow the CPU to electrically connect and mate with the socket connector, the CPU cannot be retained to the socket connector in a traditional manner.

OBJECT AND SUMMARY OF THE INVENTION

The primary object of the invention is therefore to specify a latch device for a socket connector, which is pressed against a CPU, whereby the CPU is also retained to the socket connector.

According to the invention, the object is achieved by providing a latch device for socket connector, used to press against the CPU to electrically connect the CPU with the socket connector. The latch device includes a base, a pressing frame, which is pivotally connected with the base and has a flange on one side thereof, and a pressing rod, which is pivotally arranged on the base and has a protrusion. The socket connector is arranged between the base and the pressing frame, and a CPU is mounted on the socket connector. The pressing rod is operated such that the protrusion is pressed against the flange and the pressing frame is pressed against the CPU, thereby firmly retaining the CPU to the socket connector and allowing the CPU to make an electrical connection to the socket connector.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE DISCLOSED EMBODIMENTS

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Figure 1:
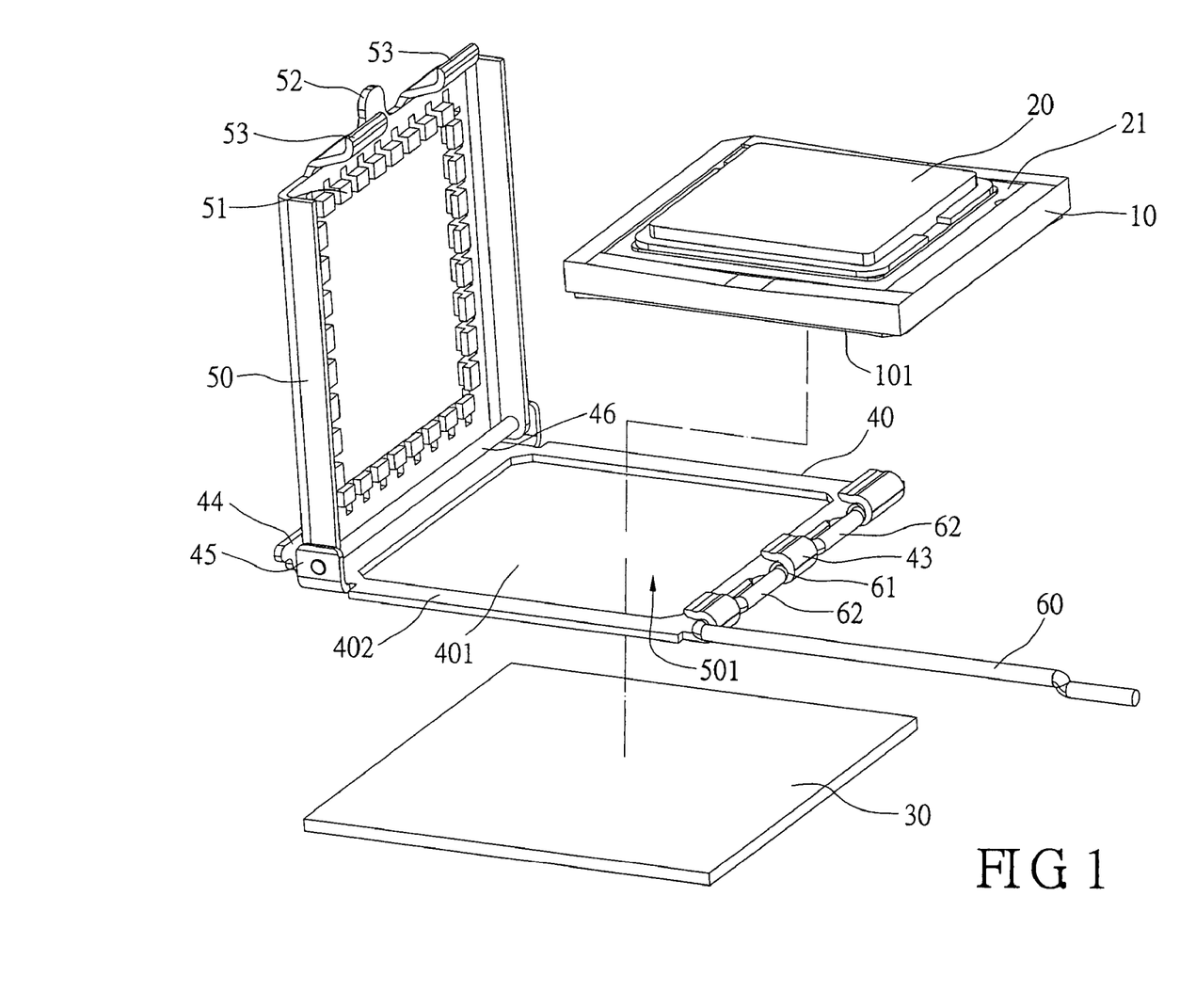
FIG. 1 is a perspective exploded view of a latch device according to a first embodiment and a socket connector of the invention.
Figure 2:
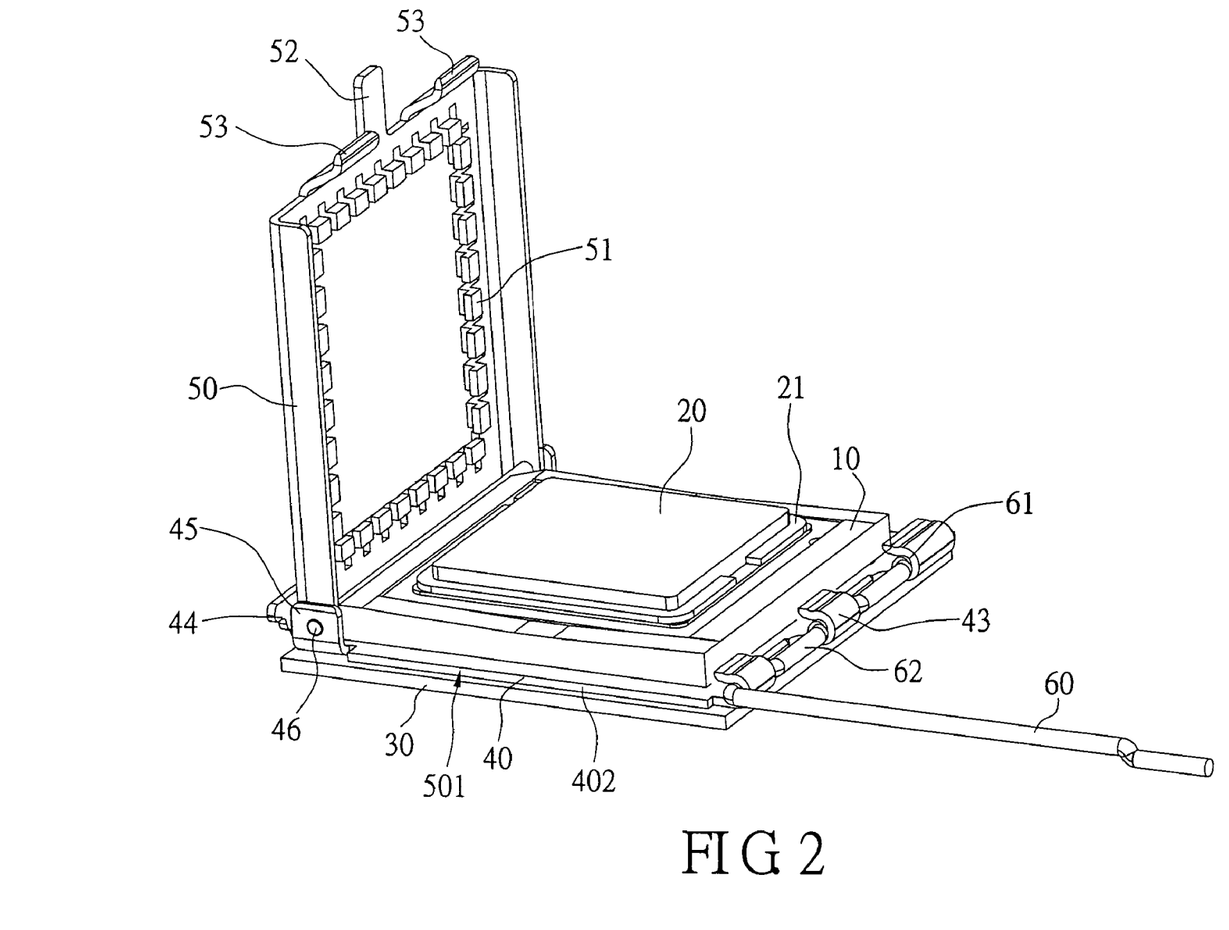
FIG. 2 is a perspective view of the latch device according to the first embodiment and the socket connector of the invention.
Figure 3:
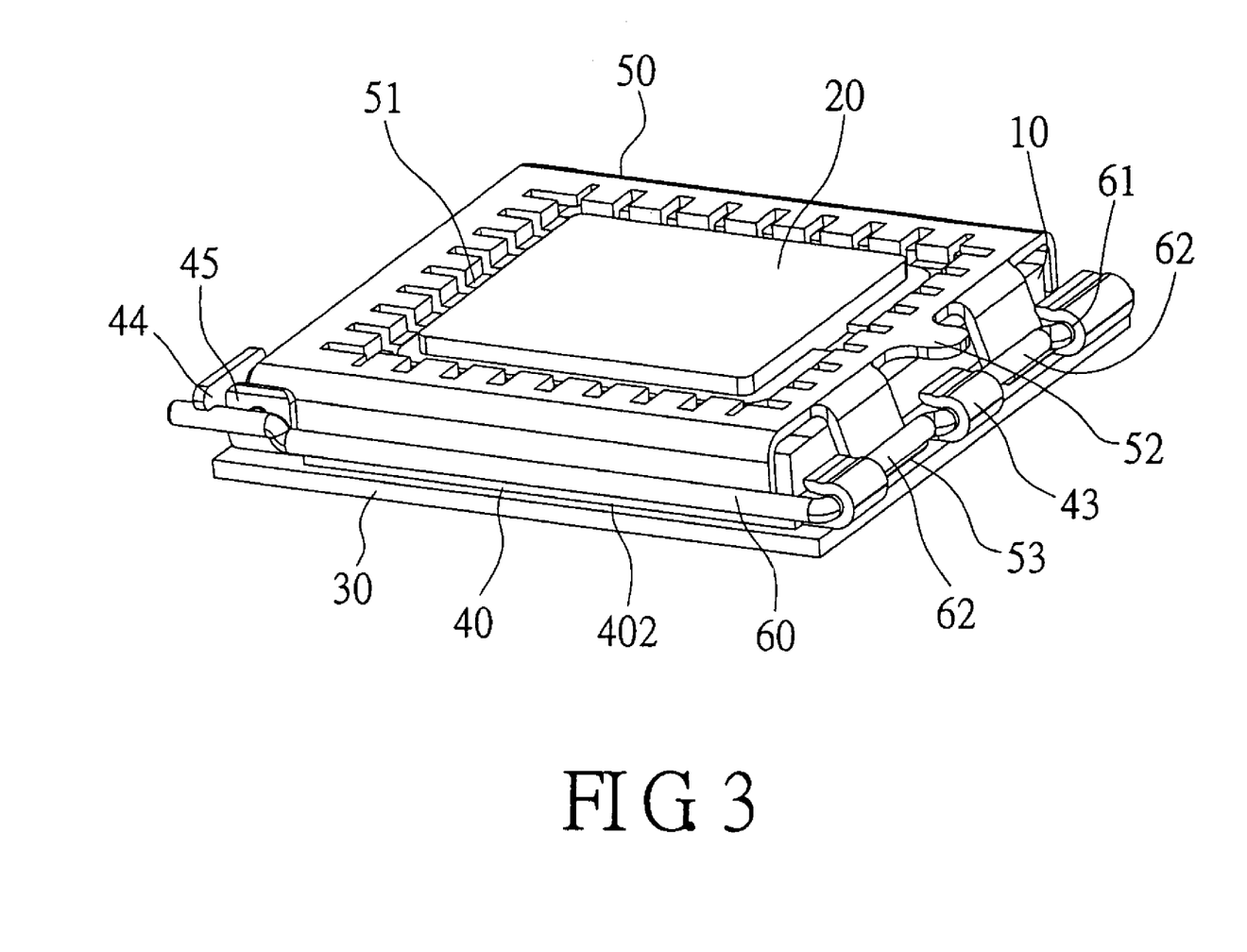
FIG. 3 is a perspective view of fastening meanings of the latch device according to the first embodiment and the socket connector of the invention.

With respect to FIG. 1, FIG. 2 and FIG. 3, the present invention provides a latch device for socket connector. The latch is used for the socket connector 10 and the CPU 20 is electrically connected with socket connector 10, whereby the CPU 20 is retained on the socket connector 10.

Figure 11:
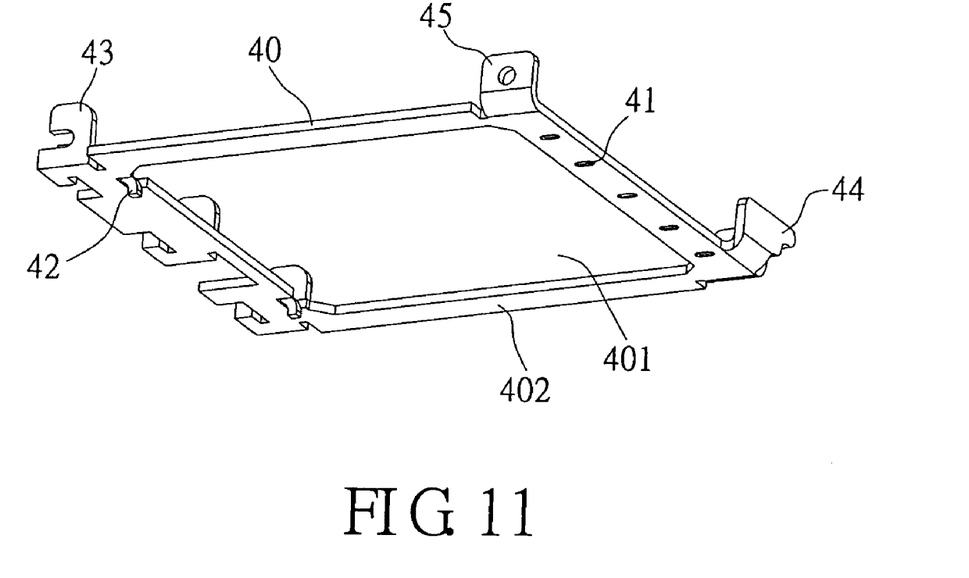
FIG. 11 is a perspective view of a base of the latch device according to the first embodiment of the invention.
Figure 12:
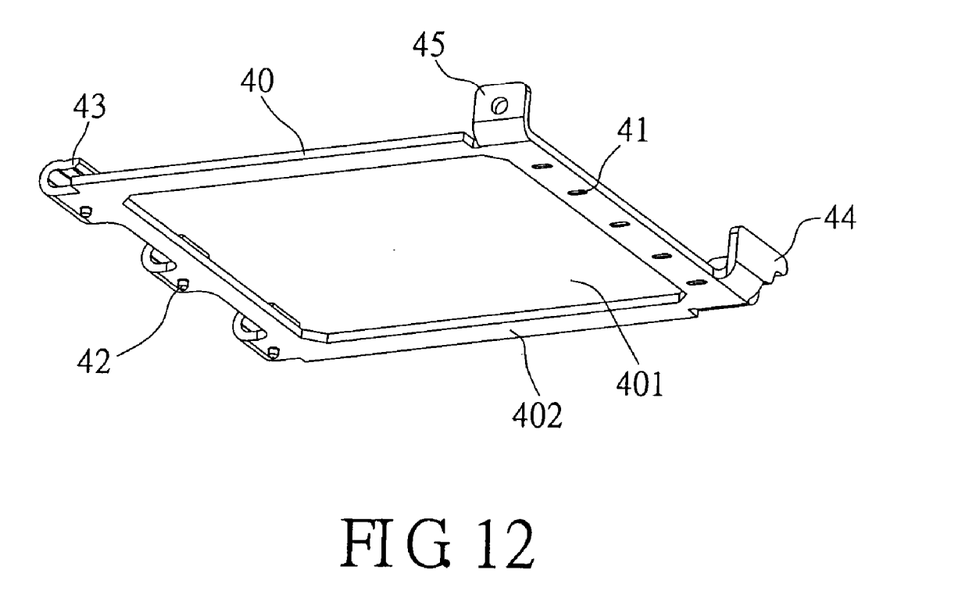
FIG. 12 is a perspective view of a base of the latch device according to the second embodiment of the invention.

The latch comprises a base 40, a pressing frame 50, and a pressing rod 60. The base 40, made of metal or other materials, is a square-shaped frame and has a hollow portion 401 and a frame 402 that forms the perimeter of the hollow portion 401. The socket connector 10 is mounted on the frame 402 of the base 40 by a recess 101 and electrically connected with circuit board through the hollow portion 401 by a plurality of solder balls, inserting pins, or by a pressing force. The bottom of the base 40 has a plurality of points of weld points 41 (for example, FIG. 11) that can be welded on the circuit board 30. Besides, the bottom of the base 40 also has a plurality of protruding pillars 42 (for example, FIG. 11) that can be penetrated and welded on the circuit board 30 to fix the base 40 on the circuit board 30 more securely. The base 40 can be welded on the circuit board 30 to increase the retaining force. One side of the base 40 is bent upward and formed with a plurality of pivoting portions 43 that can be pivotally connected to the pressing rod 60. Opposite to the pivoting portion 43, one side of the base 40 is bent upward and formed with a hook plate 44 that can be used to hook the pressing rod 60 pressed downward. Another two opposite sides of the base 40 are respectively bent upward and formed with a pivoting base 45. One of the two pivoting bases 45 is located proximate to the side with hook 44. The two pivoting bases 45 have a pivotal axle 46 penetrating therethrough, and the pivotal axle 46 can be used to pivotally connect with pressing frame 50.

The pressing frame 50, made of metal or other materials, is a generally square-shaped frame and has a pressing portion 51 extended downward at inner edge thereof. The pressing portion 51 may be a continuous pressing strip or a plurality of discrete pressing points. The pressing portion 51 in present embodiment is a plurality of discrete pressing points, such that pressing strength is more average. The pressing frame 50 is pressed against four sides of the circuit board 21 of the CPU 20 by the pressing portion 51. The pressing frame 50 is pivotally connected with one side of the base 40 by the pivot axle 46, such that the pressing frame 50 can open or close opposite to base 40. On the side of the pressing frame 50 that is opposite to the pivot point is formed a pulling portion 52 and two flanges 53. It is convenient for the pulling portion 52 to operate the pressing frame 50 from an open position to a closed position, and vice versa, and the two flanges 53 provide locations for the pressing rod 60 to press. A receiving place 501 forms between the pressing frame 50 and the base 40. The receiving place 501 is used to receive the socket connector 10, in order that the socket connector 10 is mounted between the pressing frame 50 and the base 40, and then the CPU 20 is mounted on the socket connector 10.

The pressing rod, made of metal or other materials, is a generally L-shaped rod and has a rotational axle 61 and two protrusions 62. The protrusions are offset from the rotational axle. The rotational axle 61 is pivotally arranged on the pivoting portion 43 of the base 40, such that the pressing rod 60 can pivot the rotational axle 61 to be operated. The two protrusions 62 are separately arranged on the rotational axle. The two protrusions 62 are formed by bends in the rotational axle 61. The two protrusions 62 are opposite to the two flanges 53 of the pressing frame 50. The pressing rod 60 is operated to control the two protrusions 62 to press against the two flanges 53 of the pressing frame 50 when the pressing frame is moved to its closed position.

Referring to FIG. 3, when the pressing frame 50 is pressed against the CPU 20, the pressing rod 60 can be operated so that the two protrusions 62 of the pressing rod 60 are pressed against the two flanges 53 of the pressing frame 50, such that the pressing frame 50 is firmly closed. The pressing rod 60 is retained by the hook plate 44 when the pressing frame 50 is in its closed position. With the pressing frame 50 firmly pressing against the CPU 20, the CPU 20 is also retained on the socket connector 10.

Figure 4:
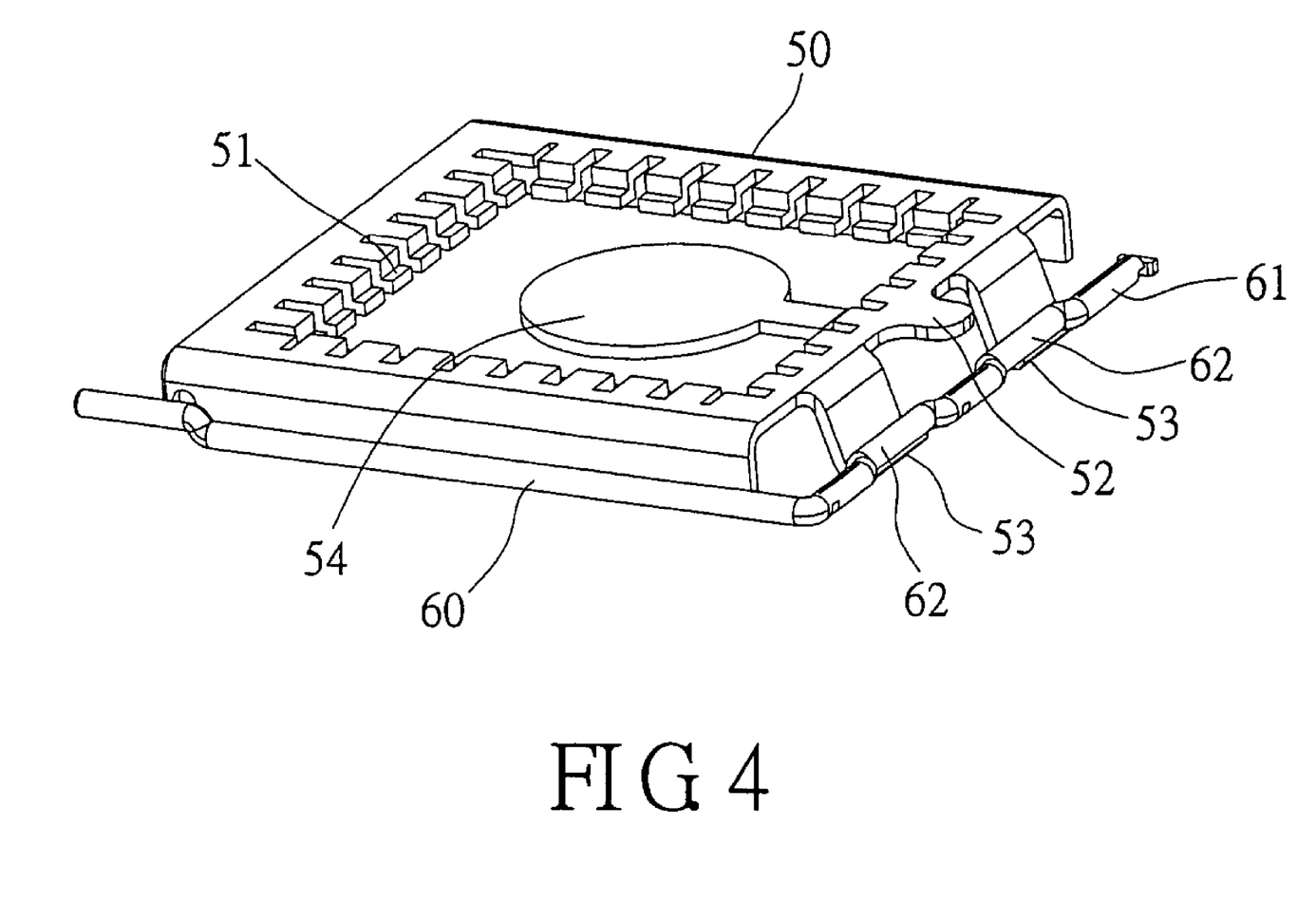
FIG. 4 is a perspective view of a latch device according to a second embodiment of the invention.
Figure 5:
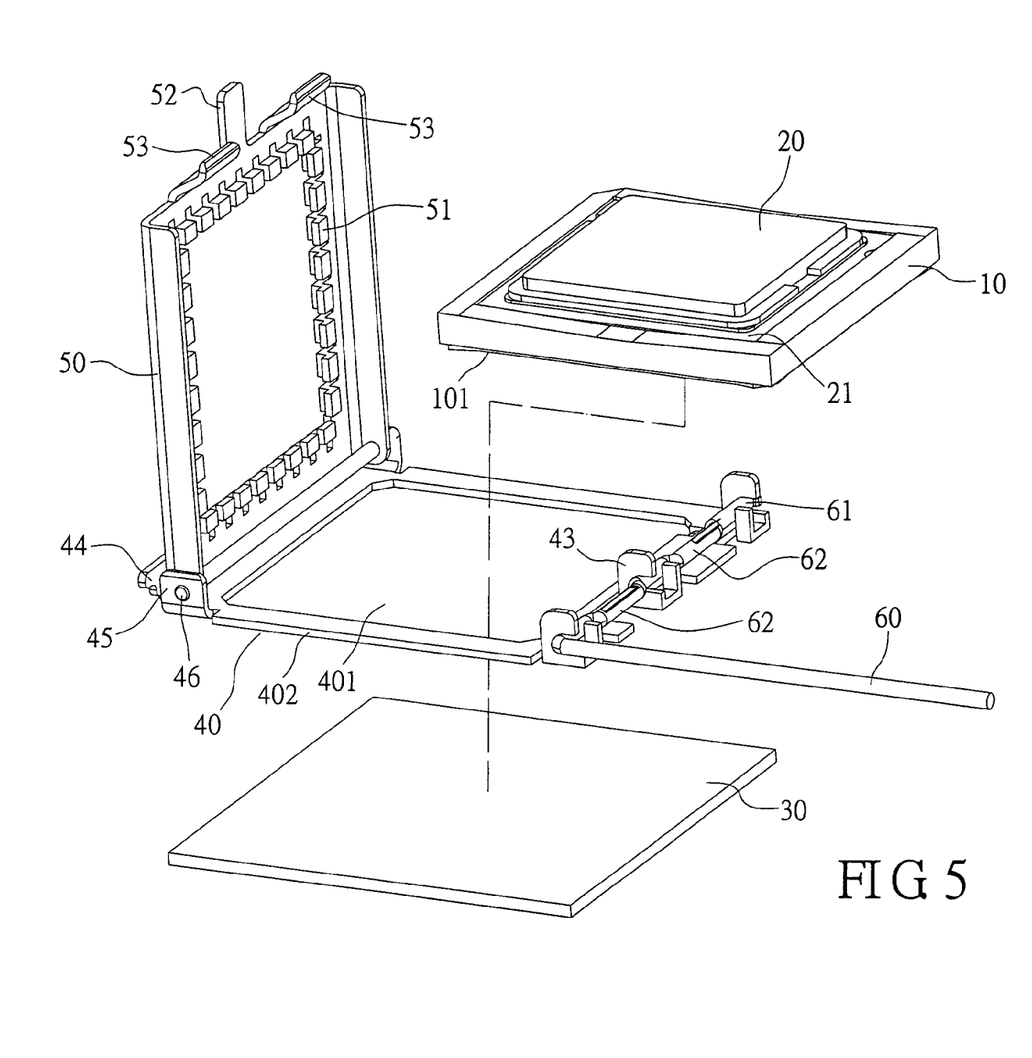
FIG. 5 is a perspective exploded view of a latch device according to a third embodiment and a socket connector of the invention.
Figure 6:
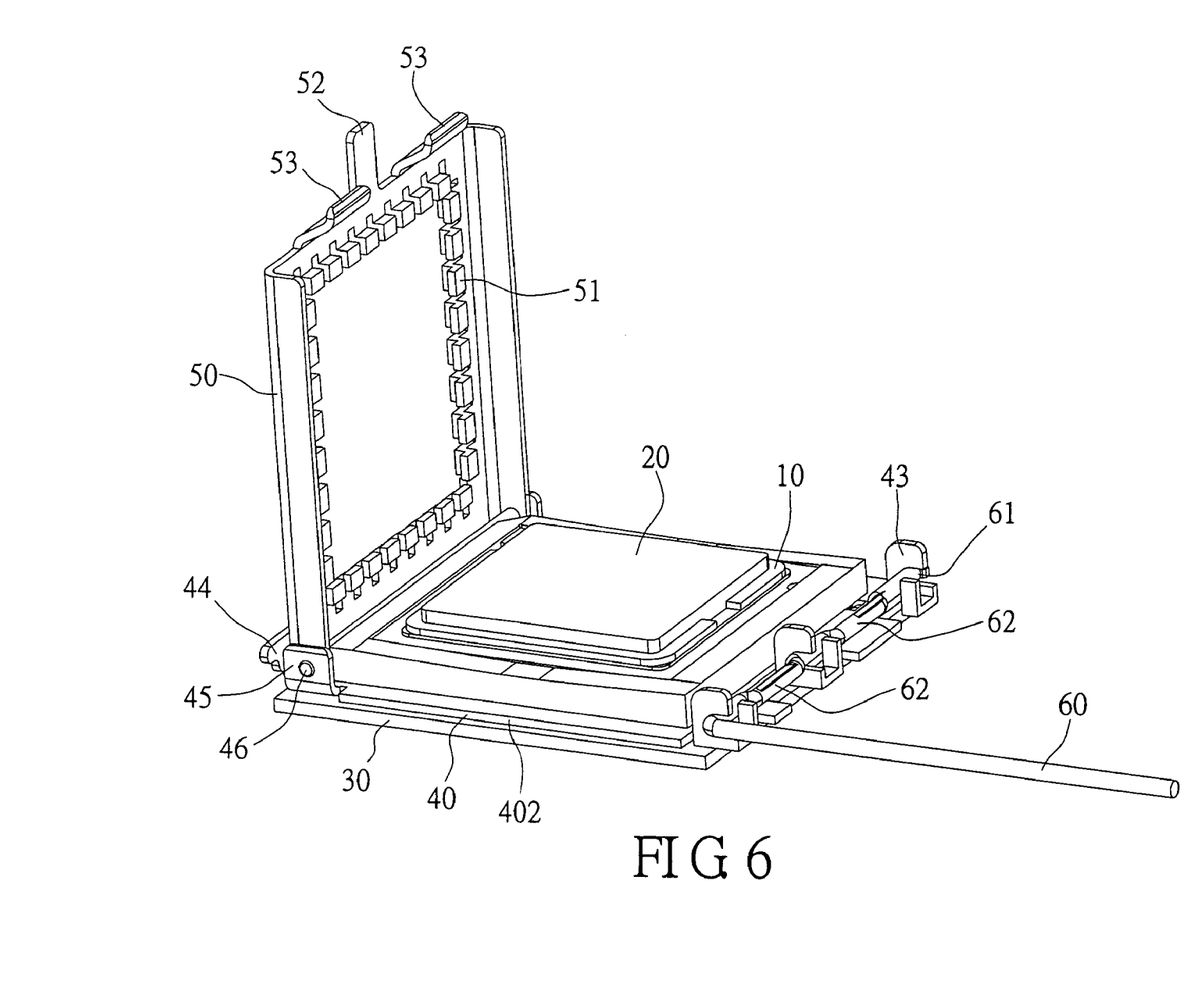
FIG. 6 is a perspective view of the latch device according to the third embodiment and the socket connector of the invention.
Figure 7:
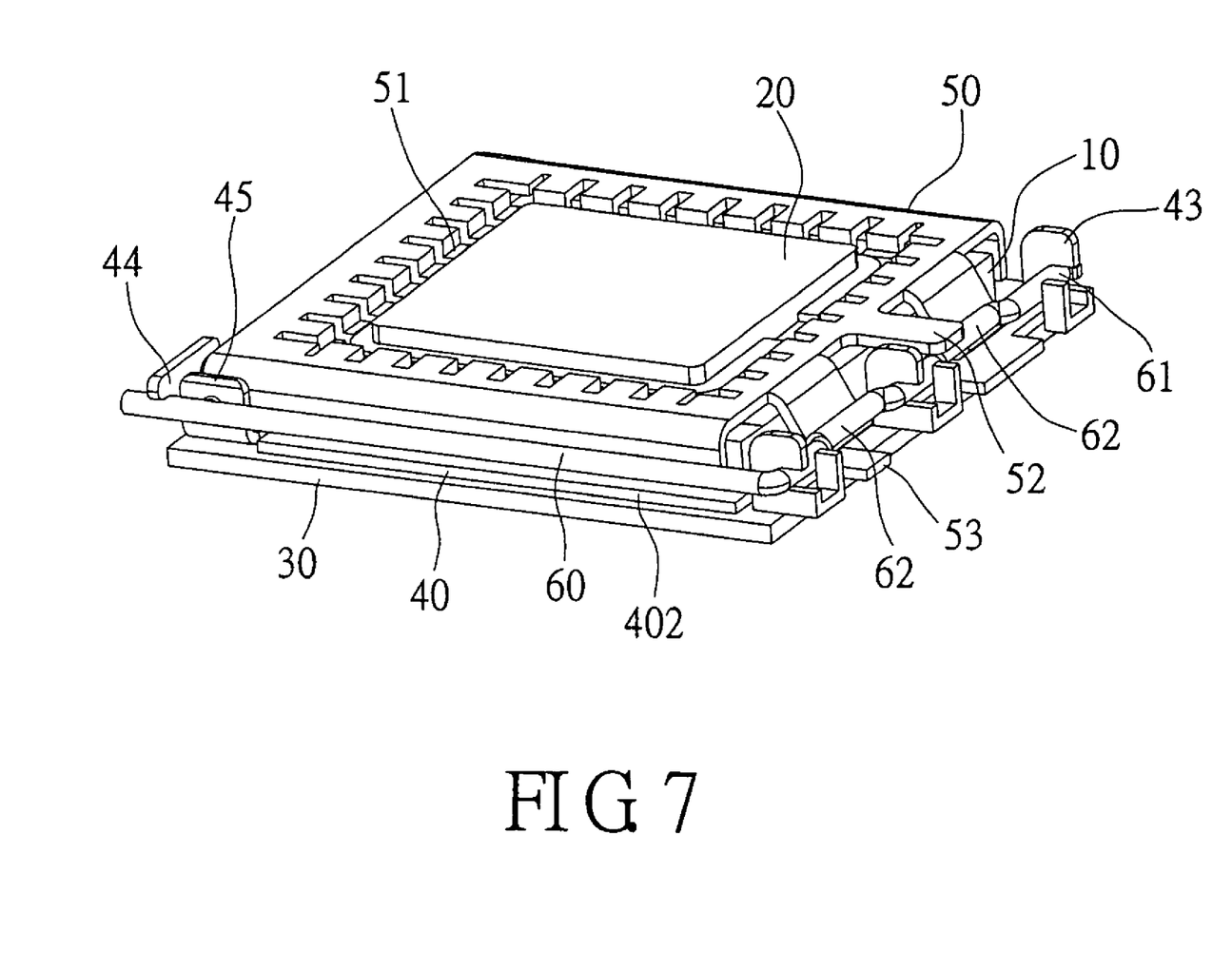
FIG. 7 is a perspective view of fastening meanings of the latch device according to the third embodiment and the socket connector of the invention.

Alternatively, referring to FIG. 4, the pressing frame 50 of the present invention has a suction plate 54 at the center-of-gravity position thereof. This suction plate 54 is designed so that it can be removed from the pressing frame as described below. The suction plate 54 is approximately a circle-shaped plate, so using vacuum adsorptive manner of manipulator can fast draw and assemble the latch device, and then remove the suction plate 54 from the pressing frame.

Alternatively, referring to FIG. 5, FIG. 6, FIG. 7, and FIG. 12, the pivoting portion 43 of the base 40 of the present invention can be upright C-shaped plates or other type designs. Shape and structure of the pivoting portion 43 are infinite, with the main function of the pivoting portion 43 to supply the rotational axle 61 of the pressing rod to be pivotally arranged.

Figure 8:
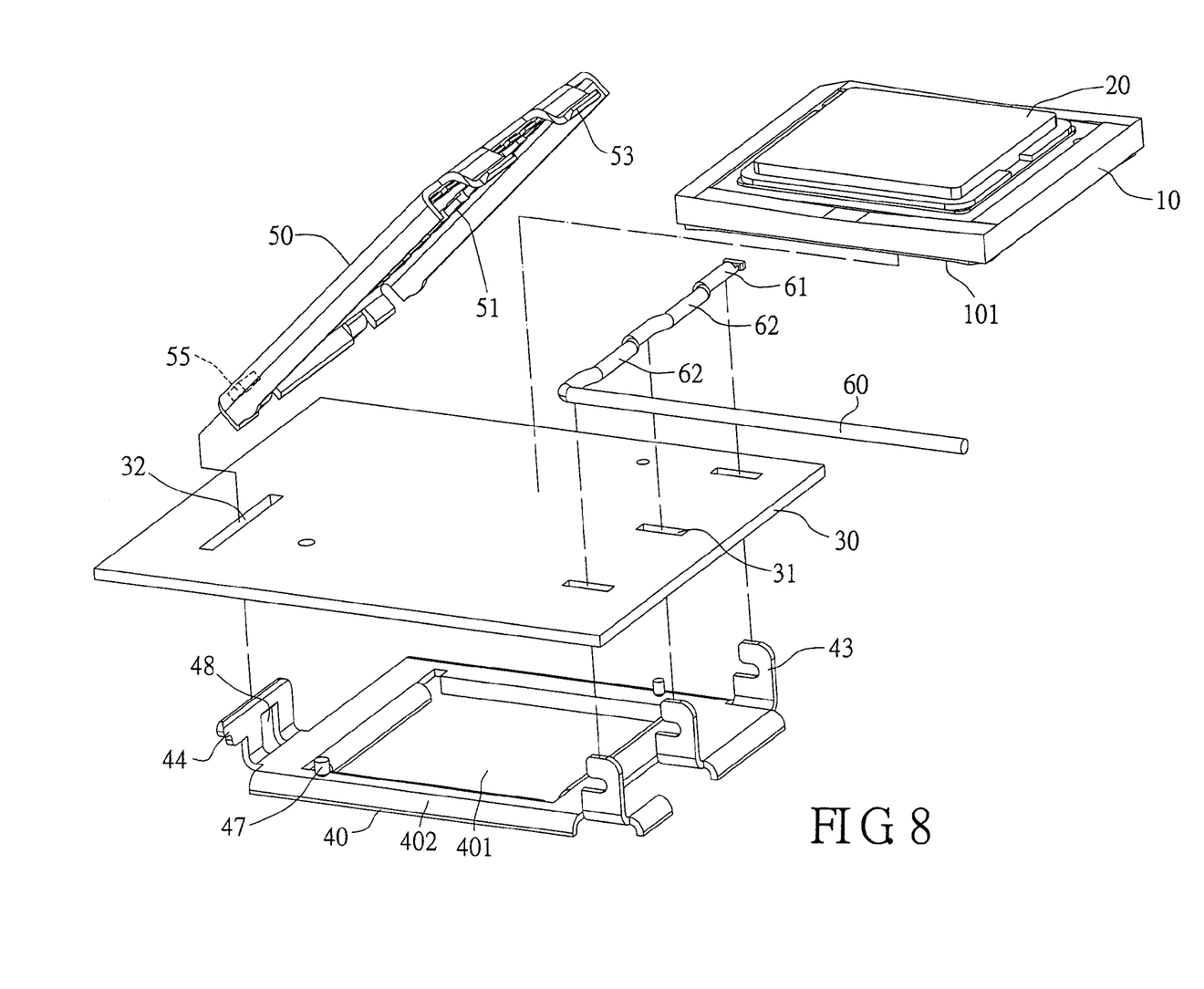
FIG. 8 is a perspective exploded view of a latch device according to a forth embodiment and a socket connector of the invention.
Figure 9:
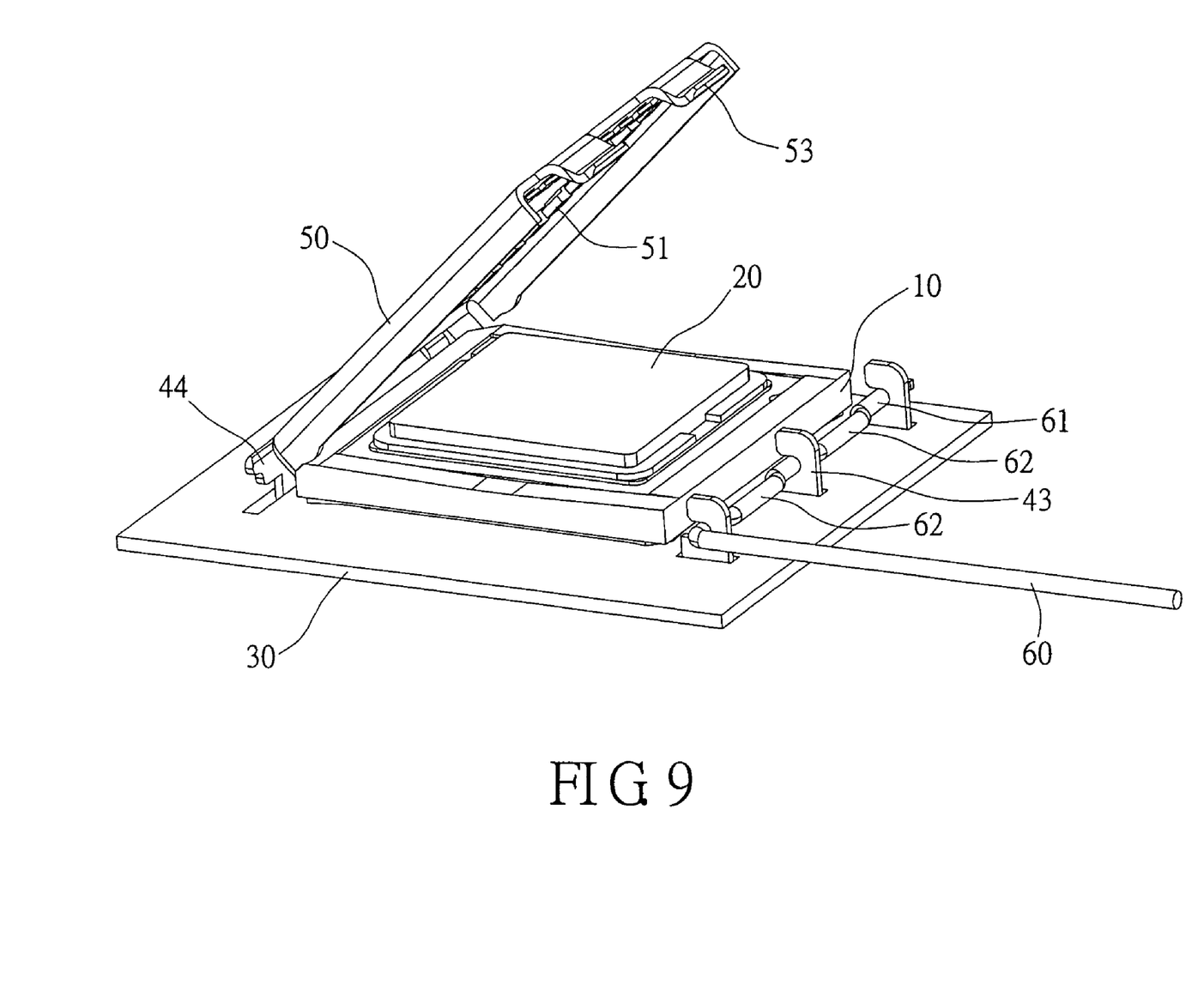
FIG. 9 is a perspective view of the latch device according to the forth embodiment and the socket connector of the invention.
Figure 10:
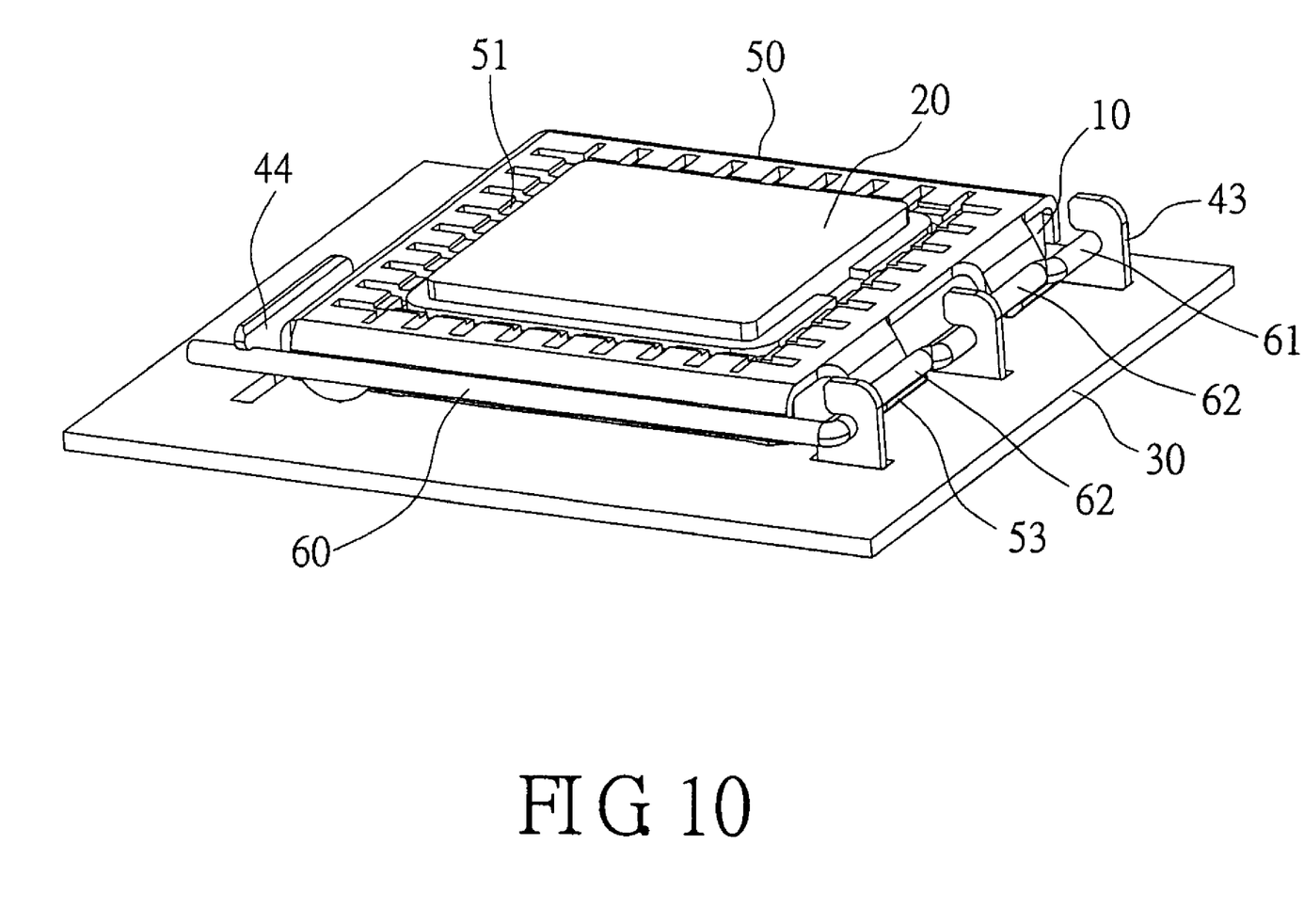
FIG. 10 is a perspective view of fastening meanings of the latch device according to the forth embodiment and the socket connector of the invention.

Alternatively, referring to FIG. 8, FIG. 9, and FIG. 10, the base 40 of the present invention also can be arranged below the circuit board 30 to form a backpanel retaining manner to hold the circuit board 30 between the base 40 and the pressing frame 50. The base 40 has a protruding pillar 47 at top thereof to be penetrated and welded on the circuit board 30. The pivoting portion 43 and the hook plate 44 of the base 40 can then pass through the top of the circuit board 30 via the corresponding through hole 31, 32 on the circuit board 30. Alternatively, the hook plate 44 has a hole 48 on one side of the base 40, and the pressing frame 50 has a corresponding bulge 55 on one side thereof. The bulge 55 can be inserted into the hole 48 such that one side of the pressing frame 50 is able to separately connect with one side of the base 40, such that the pressing frame 50 can open or close opposite to base 40.

While a preferred embodiment of the present invention is shown and described, it is envisioned that those skilled in the art may devise various modifications of the present invention without departing from the spirit and scope of the appended claims.

What is claimed is:

1. A latch device for socket connector, used to press against a central processing unit (CPU) electrically connected with a socket connector, comprising:
    a base;
    a pressing frame, pivotally connected with the base and having a flange on one side thereof; and
    a pressing rod, pivotally arranged on the base and having a protrusion, whereby, when the socket connector is arranged between the base and the pressing frame, and the pressing rod is such that the protrusion is pressed against the flange of the pressing frame, the pressing frame presses against the CPU to retain the CPU on the socket connector;
    wherein the base is located below a circuit board to hold the circuit board between the base and the pressing frame.

2. A latch device for socket connector as claimed in claim 1, wherein the base has a hollow portion and a frame forming a perimeter of the hollow portion, whereby the socket connector is mounted on the frame of the base such that a bottom portion of the socket connector is located within the hollow portion of the base.

3. A latch device for socket connector as claimed in claim 1, wherein the base has a protruding pillar used to be fixed on a circuit board.

4. A latch device for socket connector as claimed in claim 1, wherein the base is formed with a pivoting portion on one side thereof, the pressing rod having a rotational axle, the rotational axle pivotally arranged on the pivoting portion of the base.

5. A latch device for socket connector as claimed in claim 1, wherein the base has a hook plate on one side thereof used to hook the pressing rod.

6. A latch device for socket connector as claimed in claim 1, wherein the base has a pivoting base at two opposite sides, the two pivoting bases having a pivotal axle pass therethrough, the pressing frame pivotally connected with one side of the base by the pivotal axle.

7. A latch device for socket connector as claimed in claim 1, wherein the base has a hole on one side thereof and the pressing frame has a corresponding bulge on one side thereof, the bulge inserted into the hole such that one side of the pressing frame is separately pivotally connected with one side of the base.

8. A latch device for socket connector as claimed in claim 1, wherein the pressing frame has a pressing portion at inner edge thereof, the pressing portion being a continuous pressing strip.

9. A latch device for socket connector as claimed in claim 1, wherein the pressing frame has a pressing portion at inner edge thereof, the pressing portion being a plurality of discrete pressing points.

10. A latch device for socket connector as claimed in claim 1, wherein the pressing frame is formed with a pulling portion on one side thereof.

11. A latch device for socket connector as claimed in claim 10, wherein the pulling portion is located between a pair of flanges on the pressing frame.

12. A latch device for socket connector as claimed in claim 1, wherein the pressing frame has a suction plate.

13. A latch device for socket connector as claimed in claim 12, wherein the suction plate is located at a center of gravity location.

14. A latch device for socket connector as claimed in claim 12, wherein the suction plate is removable.

* * * * *